United States Patent
Guard

(10) Patent No.: US 9,160,332 B2
(45) Date of Patent: Oct. 13, 2015

(54) METHOD AND SYSTEM FOR MECHANICAL COUPLING OF FLEXIBLE PRINTED CIRCUIT TO A SENSOR

(75) Inventor: David Brent Guard, Hampshire (GB)

(73) Assignee: Atmel Corporation, San Jose, CA (US)

(*) Notice: Subject to any disclaimer, the term of this patent is extended or adjusted under 35 U.S.C. 154(b) by 108 days.

(21) Appl. No.: 13/367,511

(22) Filed: Feb. 7, 2012

(65) Prior Publication Data

US 2013/0201114 A1   Aug. 8, 2013

(51) Int. Cl.
| | | |
|---|---|---|
| *G06F 3/045* | (2006.01) | |
| *H03K 17/96* | (2006.01) | |
| *G06F 3/044* | (2006.01) | |
| *H01R 43/02* | (2006.01) | |

(52) U.S. Cl.
CPC ............ *H03K 17/9622* (2013.01); *G06F 3/044* (2013.01); *H01R 43/0256* (2013.01); *H03K 2217/96023* (2013.01); *H03K 2217/96031* (2013.01); *H03K 2217/960755* (2013.01)

(58) Field of Classification Search
CPC ........... H01L 2924/09701; H01L 2224/85201; H01L 24/05; H01L 24/06; B23K 20/10; B23K 2201/42; G06F 3/044; G06F 3/0412; G06F 3/03547; G06F 3/0414; G06F 3/046; G06F 1/1626; G06F 3/045; H03K 17/962; H03K 2217/960755; H03K 2217/96023; H03K 2217/96031; F16L 47/03
USPC .................................................. 345/173–184
See application file for complete search history.

(56) References Cited

U.S. PATENT DOCUMENTS

| | | | |
|---|---|---|---|
| 7,663,607 B2 | 2/2010 | Hotelling | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 2006/0274055 A1* | 12/2006 | Reynolds et al. ............. | 345/174 |
| 2009/0002339 A1* | 1/2009 | Reynolds et al. ............. | 345/174 |
| 2009/0315854 A1 | 12/2009 | Matsuo | |
| 2010/0155206 A1* | 6/2010 | Arione et al. ................. | 200/314 |
| 2011/0001706 A1* | 1/2011 | Sanford et al. ................ | 345/173 |
| 2012/0105356 A1* | 5/2012 | Brosnan et al. ............... | 345/174 |
| 2012/0146919 A1* | 6/2012 | Kim et al. ..................... | 345/173 |

(Continued)

FOREIGN PATENT DOCUMENTS

WO   WO 2012/129247   9/2012

OTHER PUBLICATIONS

U.S. Appl. No. 61/454,936, filed Mar. 21, 2011, Myers.

(Continued)

*Primary Examiner* — Amare Mengistu
*Assistant Examiner* — Gloryvid Figueroa-Gibson
(74) *Attorney, Agent, or Firm* — Baker Botts L.L.P.

(57) ABSTRACT

In one embodiment, a system includes a touch sensor comprising a set of electrodes and a set of one or more connection pads electrically coupled to the set of electrodes. The system also includes a circuit electrically coupled to the one or more connection pads such that signals may be communicated from the set of one or more connection pads to the circuit. The system further includes the circuit mechanically coupled to the touch sensor via friction welding.

18 Claims, 2 Drawing Sheets

(56) References Cited

U.S. PATENT DOCUMENTS

| | | | |
|---|---|---|---|
| 2012/0188194 A1* | 7/2012 | Sulem et al. | 345/174 |
| 2012/0242588 A1 | 9/2012 | Myers | |
| 2012/0242592 A1 | 9/2012 | Rothkopf | |
| 2012/0243151 A1 | 9/2012 | Lynch | |
| 2012/0243719 A1 | 9/2012 | Franklin | |
| 2013/0076612 A1 | 3/2013 | Myers | |

OTHER PUBLICATIONS

U.S. Appl. No. 61/454,950, filed Mar. 21, 2011, Lynch.

U.S. Appl. No. 61/454,894, filed Mar. 21, 2011, Rothkopf.

* cited by examiner

METHOD AND SYSTEM FOR MECHANICAL COUPLING OF FLEXIBLE PRINTED CIRCUIT TO A SENSOR

BACKGROUND

A touch sensor may detect the presence and location of a touch or the proximity of an object (such as a user's finger or a stylus) within a touch-sensitive area of the touch sensor overlaid on a display screen, for example. In a touch sensitive display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine its position on the touch screen.

DESCRIPTION OF EXAMPLE EMBODIMENTS

Figure 1:
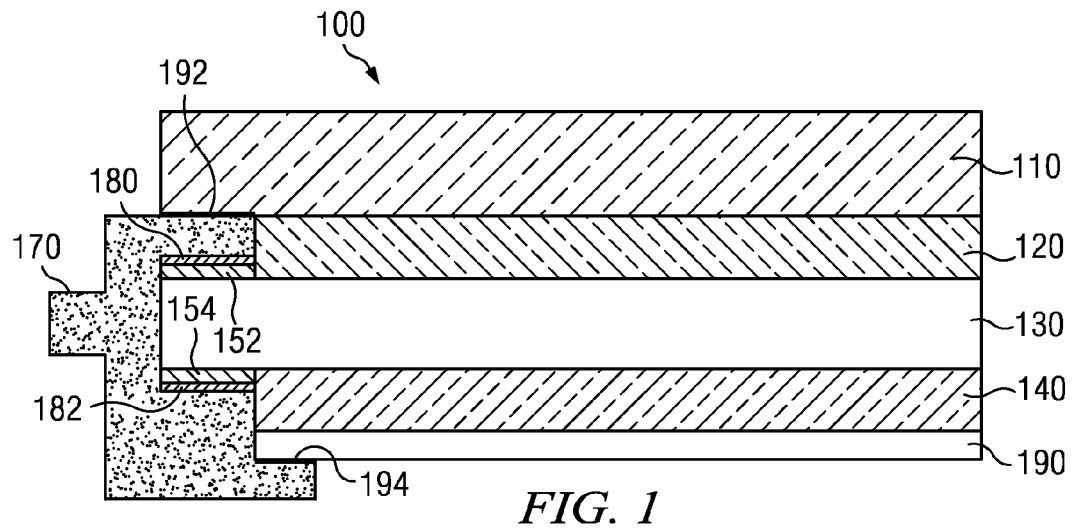
FIG. 1 illustrates one embodiment of a system used in a touch screen device.

FIG. 1 illustrates one embodiment of system 100 used in a touch-screen device. System 100 includes touch sensor 130. Coupled to touch sensor 130 are connection pads 152 and 154. Cover 110 is coupled to touch sensor 130 via adhesive 120. Circuit 170 may be electrically coupled to connection pads 152 and 154 using connection pads 180 and 182, respectively. In some embodiments, touch sensor 130 may be configured to detect touches (e.g., capacitively, the touches performed by one or more fingers or a stylus) on cover 110 and produce signals indicative of the detection. Connection pads 154 may be electrically coupled to aspects of touch sensor 130 (such as electrodes) that are aligned in one axis (e.g., the x-axis) and connection pads 152 may be electrically coupled to aspects of touch sensor 130 (such as electrodes) that are aligned in a different axis (e.g., the y-axis). In some embodiments, connection pads 154 may be capacitively coupled to connection pads 152 and may thereby receive signals from connection pads 152 and provide them to circuit 170. System 100 may also include rear protective substrate 190 coupled to touch sensor 130 via adhesive 140. Rear protective substrate 190 may provide structural strength to system 100 to prevent damage of system 100 and its various components.

In some embodiments, cover 110 may include material that allows for capacitive detection of touches on cover 110. For example, cover 110 may be made of a resilient material suitable for repeated touching such as, e.g., glass, polycarbonate, or poly(methyl methacrylate) (PMMA). Cover 110 may be clear, opaque, or may have one or more levels of suitable opacities. As an example only and not by way of limitation, cover 110 may have a thickness of approximately 1 mm. This disclosure contemplates any suitable cover made of any suitable material.

In some embodiments, adhesives 120 and/or 140 may be formed of Optically Clear Adhesives (OCA). Adhesives that have other levels of opacities other than optically clear may be used to implement adhesives 120 and/or 140. Adhesives 120 and 140 may be composed of suitable material (or combination of materials) that effectively attach touch sensor 130 to cover 110 and rear protective substrate 190. As an example only and not by way of limitation, adhesives 120 and 140 may each have a thickness of approximately 0.05 mm.

In some embodiments, connection pads 180 and 182 of circuit 170 may be coupled to connection pads 152 and 154 using a film (not shown in FIG. 1). Such film may be electrically conductive and may facilitate the adhering of connection pads 180 and 182 to connection pads 152 and 154. As examples, such film may be implemented using Anisotropic Conduction Film (ACF) or anisotropic conduction paste (ACP).

In some embodiments, touch sensor 130 may include one or more electrodes that are configured to detect touches on the surface of cover 110. Touch sensor 130 may be a single-sided touch sensor or a double-sided touch sensor, such as a double-sided FLM (fine line metal) touch sensor. For example, touch sensor 130 may be configured such that electrodes aligned in one axis (e.g., the y-axis) may be present on one surface of touch sensor 130 and electrodes aligned in a different axis (e.g., the x-axis) may be present on another surface of touch sensor 130. As another example, touch sensor 130 may be configured such that electrodes aligned in one axis (e.g., the y-axis) may be present on the same surface of touch sensor 130 (e.g., the surface that faces cover 110) as electrodes aligned in a different axis (e.g., the x-axis).

One or more portions of the substrate of touch sensor 130 may be made of polyethylene terephthalate (PET) or another suitable material. This disclosure contemplates any suitable substrate with any suitable portions made of any suitable material. In particular embodiments, the drive or sense electrodes in touch sensor 130 may be made of indium tin oxide (ITO) in whole or in part. In particular embodiments, the drive or sense electrodes in touch sensor 130 may be made of fine lines of metal or other conductive material. As an example and not by way of limitation, one or more portions of the conductive material may be copper or copper-based and have a thickness of between approximately 0.5 µm and approximately 5 µm width of between approximately 1 µm and approximately 10 µm. As another example, one or more portions of the conductive material may be silver or silver-based and similarly have a thickness of between approximately 0.5 µm and approximately 5 µm and a width of between approximately 1 µm and approximately 10 µm. This disclosure contemplates any suitable electrodes made of any suitable material.

An electrode (whether a drive electrode or a sense electrode) may be an area of conductive material forming a shape, such as for example a disc, square, rectangle, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape, where appropriate. In particular embodiments, the conductive material of an electrode may occupy substantially less than 100% of the area of its shape. As an example and not by way of limitation, an electrode may be made of fine lines of metal or other conductive material (such as for example copper, silver, or a copper- or silver-based material) and the fine lines of conductive material may occupy substantially less than 100% of the area of its shape in a hatched, mesh, or other suitable pattern. Although this disclosure describes or illustrates particular electrodes made of particular conductive material forming particular shapes with particular fills having particular patterns, this disclosure contemplates any suitable electrodes made of any suitable conductive material forming any suitable shapes with any suitable fills having any suitable patterns. Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

Touch sensor 130 may implement a capacitive form of touch sensing. In a mutual-capacitance implementation, touch sensor 130 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other through the dielectric material separating them. A pulsed or alternating voltage applied to the drive electrode may induce a charge on the sense electrode, and the amount of charge induced may be susceptible to external influence (such as a touch or the proximity of an object). When an object touches or comes within proximity of the capacitive node, a change in capacitance may occur at the capacitive node and a controller (not depicted in FIG. 1) may measure the change in capacitance. By measuring changes in capacitance throughout the array, the controller may determine the position of the touch or proximity within the touch-sensitive area(s) of touch sensor 130.

In a self-capacitance implementation, touch sensor 130 may include an array of electrodes of a single type that may each form a capacitive node. When an object touches or comes within proximity of the capacitive node, a change in self-capacitance may occur at the capacitive node and a controller may measure the change in capacitance, for example, as a change in the amount of charge needed to raise the voltage at the capacitive node by a pre-determined amount. As with a mutual-capacitance implementation, by measuring changes in capacitance throughout the array, the controller may determine the position of the touch or proximity within the touch-sensitive area(s) of touch sensor 130. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 130 may have drive electrodes disposed in a pattern on one side of a substrate and sense electrodes disposed in a pattern on another side of the substrate or both the drive electrodes and the sense electrodes may be in patterns on the same side of touch sensor 130 (e.g., when touch sensor 130 is implemented as a single-sided touch sensor). An intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes.

In some embodiments, circuit 170 may be implemented using a flexible printed circuit. Any suitable set of materials and/or components may be used to implement circuit 170 that allows for the provision of signals to touch sensor 130 (via connection pads 152 and 154) and the reception of signals from touch sensor 130 (via connection pads 152 and 154). Circuit 170 may be coupled to other components, subsystems, or systems (not depicted in FIG. 1) that may determine signals to be transmitted to touch sensor 130 and/or that may determine how signals received from touch sensor 130 are processed.

As described above, a change in capacitance at a capacitive node of touch sensor 130 may indicate a touch or proximity input at the position of the capacitive node. A controller may detect and process the change in capacitance to determine the presence and location of the touch or proximity input. The controller may then communicate information about the touch or proximity input to one or more other components (such one or more central processing units (CPUs) or digital signal processors (DSPs)) of a device that includes touch sensor 130, which may respond to the touch or proximity input by initiating a function of the device (or an application running on the device) associated with it. Although this disclosure describes a particular controller having particular functionality with respect to a particular device and a particular touch sensor, this disclosure contemplates any suitable controller having any suitable functionality with respect to any suitable device and any suitable touch sensor.

In some embodiments, tracks of conductive material disposed on the substrate of touch sensor 130 may couple the drive or sense electrodes of touch sensor 130 to connection pads 152 and 154, also disposed on the substrate of touch sensor 130. Tracks may extend into or around (e.g. at the edges of) the touch-sensitive area(s) of touch sensor 130. Particular tracks may provide drive connections for coupling circuit 170 to drive electrodes of touch sensor 130, through which circuit 170 may supply drive signals to the drive electrodes. Other tracks may provide sense connections for coupling circuit 170 to sense electrodes of touch sensor 130, through which charge at the capacitive nodes of touch sensor 130 may be sensed. Tracks may be made of fine lines of metal or other conductive material. As an example and not by way of limitation, the conductive material of tracks may be copper or copper-based and have a width of between approximately 10 μm and 100 μm. As another example, the conductive material of tracks may be silver or silver-based and have a width of between approximately 10 μm and 100 μm. In particular embodiments, tracks may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks, touch sensor 130 may include one or more ground lines terminating at a ground connector (which may be a connection pad) at an edge of the substrate of touch sensor 130 (similar to the tracks described above). In some embodiments, connection pads 152 and 154 may be implemented using conductive material, such as copper and may be located along one or more edges of the substrate, outside the touch-sensitive area(s) of touch sensor 130. Connection pads 152 and 154 may be implemented as tracks.

One or more portions of the substrate of rear protective substrate 190 may be made of polyethylene terephthalate (PET) or another suitable material. This disclosure contemplates any suitable substrate with any suitable portions made of any suitable material.

As shown in FIG. 1, circuit 170 may be mechanically coupled to touch sensor 130. In some embodiments, circuit 170 may be mechanically coupled to touch sensor 130 via friction welding and/or another localized welding technique. As is known in the art, friction welding is a class of solid-state welding processes that generates heat through mechanical friction between a moving workpiece and a stationary component, with the addition of a lateral force called "upset" to plastically displace and fuse the materials. For example, as seen in FIG. 1, portions of circuit 170 not having connection pads 180 and 182 and/or other electrical components (e.g., traces and/or electrodes) formed thereupon may be friction welded to portions of touch sensor 130 not having connection pads 152 and 154 formed and/or other electrical components (e.g., traces and/or electrodes) thereupon. Circuit 170 may further be coupled to cover 110 via friction welding (e.g., as shown by friction weld 192 in FIG. 1), another localized welding technique, adhesive 120, or other suitable manner providing additional structural strength for components of system 100. If circuit 170 is friction welded to cover 110, cover 110 may be made of a material suitable for friction welding, such as polycarbonate, PMMA, or any suitable clear, hard, polymer compounds. In these and other embodiments, circuit 170 may also be coupled to rear protective substrate 190 via friction welding (e.g., as shown by friction weld 194 in FIG. 1), another localized welding technique, adhesive 140, or other suitable manner, which may also provide additional structural strength for components of system 100. Such use of friction welding or another localized welding technique to couple circuit 170 to sensor 130 may increase adhesion of circuit 170 as compared with traditional approaches (e.g., coupling of circuit 170 to touch sensor 130 via an adhesive such as adhesive 140 or via a conductive film, for example), thus increasing an effective peel strength of an FPC assembly. Furthermore, in single-sided designs in which connection pads and electrodes are disposed on only one side of touch sensor 130 (in which the connection pad area is generally unsupported and relatively thin in profile), such friction welding or other localized welding of circuit 170 to touch sensor 130 provides additional structural strength for system 100 as compared to traditional approaches. In some embodiments, friction welding may be used to mechanically bond components of system 100 at optically opaque portions of system 100.

Figure 2:
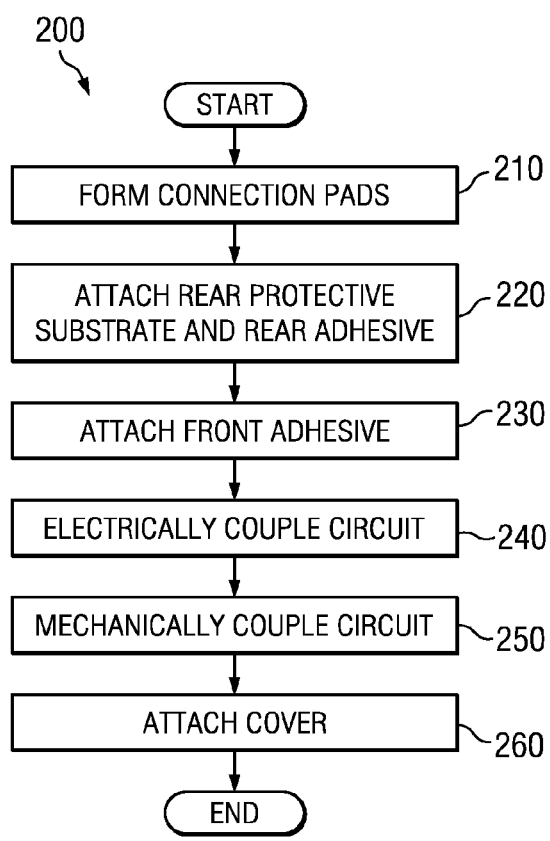
FIG. 2 illustrates one embodiment of manufacturing a touch sensing system.

FIG. 2 illustrates one embodiment of manufacturing a touch sensing system. In general, the steps illustrated in FIG. 2 may be combined, modified, or deleted where appropriate, and additional steps may also be added to the example operation. Furthermore, the described steps may be performed in any suitable order. In some embodiments, the steps described below may be performed by any suitable combination of the elements discussed above with respect to FIG. 1.

The method may start at step 210, where, in some embodiments, connection pads may be formed on a touch sensor. The touch sensor may include electrodes that are configured to detect touches on a cover that is near the touch sensor. Each connection pad may be formed in FLM or printed in silver such that electrodes of the touch sensor may be coupled to one or more components that process signals received from the electrodes or provide signals to the electrodes. The touch sensor may have electrodes on more than one side of the touch sensor and connection pads may be formed on more than one side of the touch sensor. As an example, this step may be used to form connection pads 152 and 154 on touch sensor 130 of FIG. 1.

At step 220, in some embodiments, a circuit may be electrically coupled to at least some of the connection pads coupled at step 210. Examples of circuits that may be coupled at this step are given above with respect to circuit 170 of FIG. 1. At this step, in some embodiments, the circuit may only be arranged on one side of the touch sensor. For example, the circuit may only be directly coupled to connection pads that are located on one side of the touch sensor. The circuit may be coupled using anisotropic conduction film bonding.

At step 230, the circuit may be mechanically coupled to the touch sensor via friction welding another localized welding technique, or similar technique. This step may be performed before, during, or after step 220. For example, portions of the circuit not having connection pads and/or other electrical components (e.g., traces and/or electrodes) formed thereon may be friction welded to portions of the touch sensor not having connection pads and/or other electrical components (e.g., traces and/or electrodes) formed thereon.

At step 240, in some embodiments, a cover may be attached. Examples of covers may be attached at step are given above with respect to cover 110 of FIG. 1. A cover may be attached using an adhesive to the touch sensor and/or attached to the circuit using an adhesive, friction welding, another localized welding technique, or other suitable approach. Examples of adhesives that may be used at step are given above with respect to adhesive 120 of FIG. 1. The cover attached at this step may be the element that receives touches such as for example, a glass or plastic face of a touch input device (e.g., a phone, tablet, or instrument panel). In-mold lamination (IML) may be used at this step to form the cover. In some embodiments, having the touch sensor coupled to the circuit on the surface opposite to the surface that interfaces with the cover may result in less expensive and faster manufacturing. For example, the surface of the touch sensor that interfaces with cover may be completely covered with optically clear adhesive without the need of cutouts in the adhesive because the circuit is not coupled to the touch sensor on this surface. This may also obviate any alignment procedures performed when making such cutouts in the adhesive and laminating to the touch sensor.

At step 250, in some embodiments, a rear protective substrate may be attached. Examples of rear protective substrates may be attached at step are given above with respect to rear protective substrate 190 of FIG. 1. A rear protective substrate may be attached using an adhesive to the touch sensor and/or attached to the circuit using an adhesive, friction welding, another localized welding technique, or other suitable approach. Examples of adhesives that may be used at step are given above with respect to adhesive 140 of FIG. 1.

At step 260, in some embodiments, a controller may be coupled to the circuit attached at step 220, at which point the method may end. The controller may be configured to analyze signals generated by the touch sensor and/or may be configured to generate signals to be sent to the touch sensor. For example, the controller may send a drive signal to certain electrodes of the touch sensor and may analyze the signals received from electrodes that did not receive the drive signal to determine whether touch has occurred. Examples of the controller coupled at step 260 are discussed below with respect to control unit 380 of FIG. 3.

The steps recited above with respect to FIG. 2 may be performed in any suitable order. For example, step 260 may occur before step 240 or step 250. As another example, step 230 may occur before step 220. As another example, certain aspects of step 230 may be performed at the same time as step 220.

Furthermore, although this disclosure describes and illustrates particular components, devices, or systems carrying out particular steps of the method of FIG. 2, this disclosure contemplates any suitable combination of any suitable components, devices, or systems carrying out any suitable steps of the method of FIG. 2.

Figure 3:
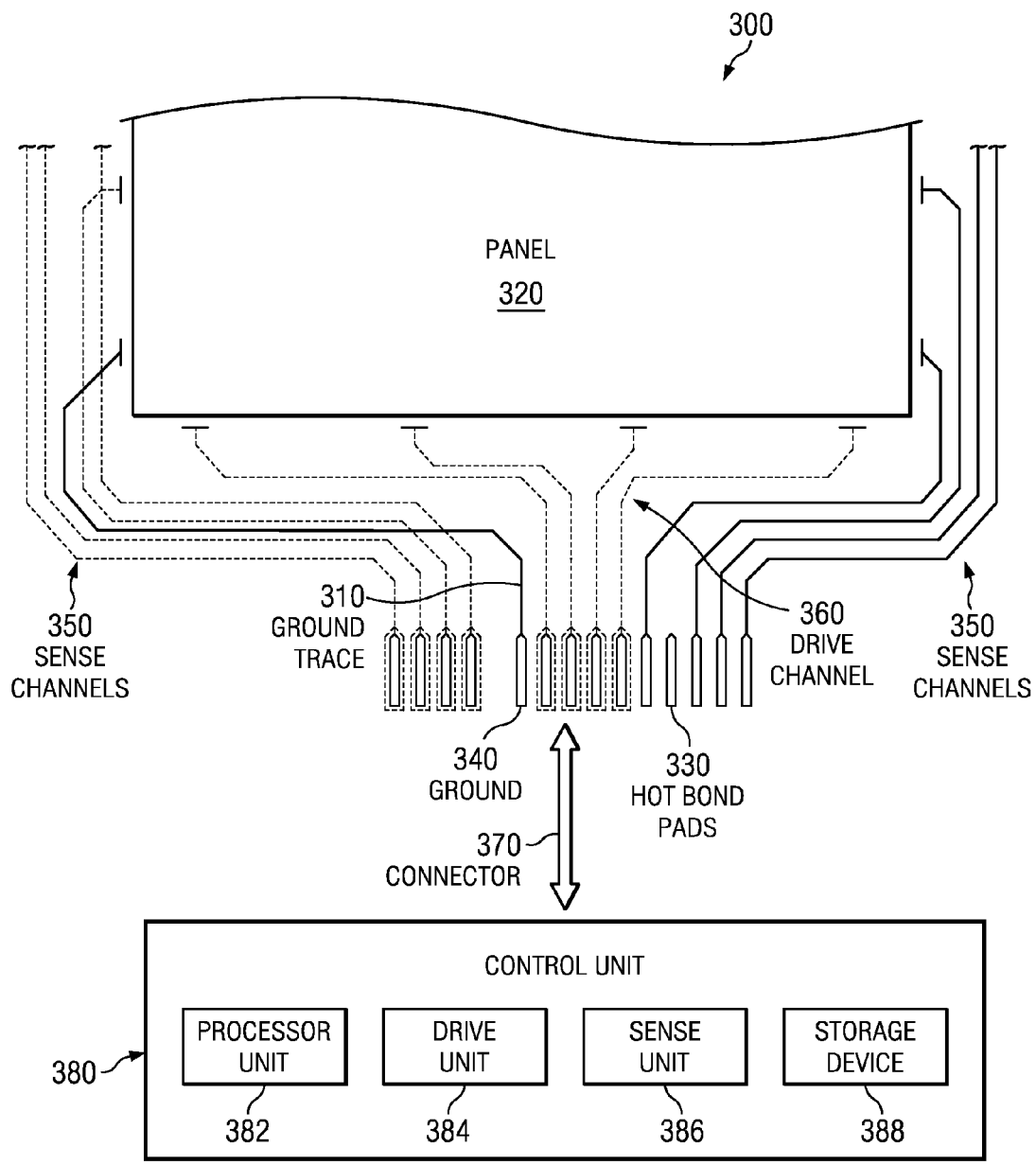
FIG. 3 illustrates an example touch-screen system.

FIG. 3 illustrates an example touch-screen system 300. System 300 includes touch sensitive panel 320 that is coupled to hot connection pads 330 and ground 340 using ground trace 310, sense channels 350, drive channels 360. The drive and sense channels 350 and 360 are connected to a control unit 380 via a connector 370. In the example, the traces forming the channels have hot connection pads 330, to facilitate electrical connection via the connector 370. As an example, control unit 380 may cause a drive signal to be sent to panel 320 via drive channel 360. Signals detected in panel 320 may be sent to control unit 380 via sense channels 350. As discussed further below, control unit 380 may process the signals to determine whether an object has contacted panel 320 or is in proximity to panel 320. As depicted by the dotted lines in FIG. 3, sense channels 350 may be formed within a different layer of touch-screen system 300 than that of drive channel 360 and ground trace 310.

In particular embodiments, panel 320 may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with conductive material forming drive and sense electrodes. Panel 320 may also include a second layer of OCA and another substrate layer (which may be made of PET or another suitable material). The second layer of OCA may be disposed between the substrate with the conductive material making up the drive and sense electrodes and the other substrate layer, and the other substrate layer may be disposed between the second layer of OCA and an air gap to a display of a device including a touch sensor and a controller. As an example only and not by way of limitation, the cover panel may have a thickness of approximately 1 mm; the first layer of OCA may have a thickness of approximately 0.05 mm; the substrate with the conductive material forming the drive and sense electrodes may have a thickness of approximately 0.05 mm (including the conductive material forming the drive and sense electrodes); the second layer of OCA may have a thickness of approximately 0.05 mm; and the other layer of substrate disposed between the second layer of OCA and the air gap to the display may have a thickness of approximately 0.5 mm. Although this disclosure describes a particular number of particular layers made of particular materials and having particular thicknesses, this disclosure contemplates any suitable mechanical stack with any suitable number of any suitable layers made of any suitable materials and having any suitable thicknesses. In particular embodiments, panel 320 may be implemented using the embodiments disclosed above with respect to FIG. 1.

In particular embodiments, control unit 380 may be one or more integrated circuits (ICs)—such as for example general-purpose microprocessors, microcontrollers, programmable logic devices or arrays, application-specific ICs (ASICs), tangible, non-transitory, computer-readable storage media—on a flexible printed circuit (FPC). Control unit 380 may include processor unit 382, drive unit 384, sense unit 386, and storage device 388. Drive unit 384 may supply drive signals to the drive electrodes of panel 320. Control unit 380 may supply drive signals to the drive electrodes of panel 320. Sense unit 386 may sense charge at the capacitive nodes included in panel 320 and provide measurement signals to processor unit 382 representing capacitances at the capacitive nodes. Processor unit 382 may control the supply of drive signals to the drive electrodes by drive unit 384 and process measurement signals from sense unit 386 to detect and process the presence and location of a touch or proximity input within the touch-sensitive area(s) of panel 320. Processor unit 382 may also track changes in the position of a touch or proximity input within the touch-sensitive area(s) of panel 320. Storage device 388 may store programming for execution by processor unit 382, including programming for controlling drive unit 384 to supply drive signals to the drive electrodes, programming for processing measurement signals from sense unit 386, and other suitable programming, where appropriate. Although this disclosure describes a particular control unit 380 having a particular implementation with particular components, this disclosure contemplates any suitable control unit having any suitable implementation with any suitable components.

Depending on the specific features implemented, particular embodiments may exhibit some, none, or all of the following technical advantages. Manufacturing of touch sensitive systems (e.g., touch screens) may be performed faster. Manufacturing of touch sensitive systems (e.g., touch screens) may be performed at a lower cost than conventional techniques. Increased yield may be realized during manufacturing. Tooling for manufacturing may become more simplified. Moisture ingress in touch sensitive systems (e.g., touch screens) may be reduced or eliminated. The reliability of an interface between a touch sensor and processing components may be enhanced. Other technical advantages will be readily apparent to one skilled in the art from the preceding figures and description as well as the proceeding claims. Particular embodiments may provide or include all the advantages disclosed, particular embodiments may provide or include only some of the advantages disclosed, and particular embodiments may provide none of the advantages disclosed.

Herein, reference to a computer-readable storage medium encompasses one or more non-transitory, tangible computer-readable storage media possessing structure. As an example and not by way of limitation, a computer-readable storage medium may include a semiconductor-based or other IC (such, as for example, a field-programmable gate array (FPGA) or an ASIC), a hard disk, an HDD, a hybrid hard drive (HHD), an optical disc, an optical disc drive (ODD), a magneto-optical disc, a magneto-optical drive, a floppy disk, a floppy disk drive (FDD), magnetic tape, a holographic storage medium, a solid-state drive (SSD), a RAM-drive, a SECURE DIGITAL card, a SECURE DIGITAL drive, or another suitable computer-readable storage medium or a combination of two or more of these, where appropriate. Herein, reference to a computer-readable storage medium excludes any medium that is not eligible for patent protection under 35 U.S.C. §101. Herein, reference to a computer-readable storage medium excludes transitory forms of signal transmission (such as a propagating electrical or electromagnetic signal per se) to the extent that they are not eligible for patent protection under 35 U.S.C. §101. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A system comprising:
    a touch sensor operable to determine a position of a touch within a touch-sensitive area of the touch sensor, the touch sensor comprising:
        a non-touch-sensitive portion located along one or more edges of the touch sensor;
        a first set of electrodes; and
        a first set of one or more connection pads electrically coupled to the first set of electrodes and located on a first side of the touch sensor in the non-touch-sensitive portion; and
    a circuit comprising a second set of one or more connection pads located on a first side of the circuit, wherein the circuit is:
        a flexible printed circuit;
        electrically coupled to the first set of one or more connection pads such that signals may be communicated from the first set of one or more connection pads to the circuit; and
        mechanically coupled to the touch sensor via friction welding, wherein the mechanical coupling couples a portion of the first side of the touch sensor located between the first set of connection pads in the non-touch-sensitive portion to a portion of the first side of the circuit located between the second set of connection pads.

2. The system of claim 1 further comprising:
    a second set of electrodes, the touch sensor comprising the second set of electrodes; and
    a third set of one or more connection pads electrically coupled to the second set of electrodes and electrically coupled to the circuit.

3. The system of claim 2, wherein:
    the first set of electrodes and the first set of one or more connection pads are located on the first side of the touch sensor; and
    the second set of electrodes and the third set of one or more connection pads are located on a second side of the touch sensor, the first side of the touch sensor and the second side of the touch sensor being located on different sides of a same substrate.

4. The system of claim 2, wherein:
    the first set of electrodes are arranged along a first axis; and
    the second set of electrodes are arranged along a second axis, the first and second axes being substantially perpendicular to each other.

5. The system of claim 1, wherein one or more portions of the first set of electrodes comprises indium tin oxide (ITO).

6. The system of claim 1, wherein the circuit is mechanically coupled to the touch sensor via friction welding at portions of the touch sensor not having any connection pads, electrodes, and traces coupled thereto.

7. The system of claim 1, further comprising a cover coupled to the touch sensor via an adhesive.

8. The system of claim 7, further comprising the cover coupled to the circuit via friction welding.

9. The system of claim 7, further comprising a rear protective substrate coupled to the touch sensor via a second adhesive and to the circuit via friction welding.

10. The system of claim 1, the circuit mechanically coupled to the touch sensor via friction welding at optically opaque portions of the touch sensor.

11. A method comprising:
    electrically coupling a first set of one or more connection pads to a first set of electrodes, a touch sensor comprising the first set of electrodes and the first set of one or more connection pads, the first set of one or more connection pads located on a first side of the touch sensor in non-touch-sensitive portion along one or more edges of the touch sensor;
    electrically coupling a circuit to the first set of one or more connection pads such that signals may be communicated from the first set of one or more connection pads to the circuit;
    mechanically coupling the circuit to the touch sensor via friction welding; and
    wherein:
        the circuit is a flexible printed circuit;
        the circuit comprises a second set of one or more connection pads located on a first side of the flexible printed circuit; and
        the mechanical coupling couples a portion of the first side of the touch sensor located between the first set of connection pads in the non-touch-sensitive portion to a portion of the first side of the circuit located between the second set of connection pads.

12. The method of claim 11 further comprising:
    electrically coupling a third set of one or more connection pads to a second set of electrodes, the touch sensor comprising the second set of electrodes; and
    electrically coupling the third set of one or more connection pads to the circuit.

13. The method of claim 12, wherein:
    electrically coupling the first set of one or more connection pads to the first set of electrodes comprises electrically coupling the first set of one or more connection pads to the first set of electrodes such that the first set of electrodes and the first set of one or more connection pads are located on the first side of the touch sensor; and electrically coupling the third set of one or more connection pads to the second set of electrodes comprises electrically coupling the third set of one or more connection pads to the second set of electrodes such that the second set of electrodes and the third set of one or more connection pads are located on a second side of the touch sensor, the first side of the touch sensor and the second side of the touch sensor being located on different sides of a same substrate.

14. The method of claim 11, wherein mechanically coupling the circuit to the touch sensor via friction welding comprising mechanically coupling the circuit to the touch sensor via friction welding at portions of the touch sensor not having any connection pads, electrodes, and traces coupled thereto.

15. The method of claim 11, further comprising mechanically coupling a cover to the touch sensor via an adhesive.

16. The method of claim 15, further comprising mechanically coupling the cover to the circuit via friction welding.

17. The method of claim 15, further comprising mechanically coupling a protective substrate to the touch sensor via a second adhesive and to the circuit via friction welding.

18. The method of claim 11, wherein mechanically coupling the circuit to the touch sensor via friction welding comprises mechanically coupling the circuit to the touch sensor at optically opaque portions of the touch sensor.

* * * * *